US011619654B2

(12) United States Patent
Suemasa et al.

(10) Patent No.: US 11,619,654 B2
(45) Date of Patent: Apr. 4, 2023

(54) PROBE FOR CHARACTERISTIC INSPECTION OF A CONNECTOR

(71) Applicant: Murata Manufacturing Co., Ltd., Kyoto-fu (JP)

(72) Inventors: Hajime Suemasa, Nagaokakyo (JP); Shinichi Kenzaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 148 days.

(21) Appl. No.: 17/320,123

(22) Filed: May 13, 2021

(65) Prior Publication Data

US 2021/0263072 A1  Aug. 26, 2021

Related U.S. Application Data

(63) Continuation of application No. PCT/JP2019/044542, filed on Nov. 13, 2019.

(30) Foreign Application Priority Data

Nov. 19, 2018  (JP) .............................. JP2018-216673

(51) Int. Cl.
*G01R 1/067* (2006.01)
*H01R 13/629* (2006.01)

(52) U.S. Cl.
CPC ..... *G01R 1/06722* (2013.01); *G01R 1/06733* (2013.01); *H01R 13/629* (2013.01)

(58) Field of Classification Search
CPC ............ G01R 1/06722; G01R 1/06733; H01R 13/629
See application file for complete search history.

(56) References Cited

U.S. PATENT DOCUMENTS 5,227,718 A      7/1993   Stowers et al.
2017/0227579 A1*  8/2017   Yui ..................... G01R 31/2822

FOREIGN PATENT DOCUMENTS

JP    S63-037261 A    2/1988
JP    H04-071173 U    6/1992
(Continued)

OTHER PUBLICATIONS

International Search Report issued in PCT/JP2019/044542; dated Jan. 28, 2020.
(Continued)

*Primary Examiner* — Paresh Patel
(74) *Attorney, Agent, or Firm* — Studebaker & Brackett PC

(57) ABSTRACT

A probe for characteristic inspection of a connector includes a plunger, a coaxial cable, a flange, and a housing having an end portion on one side including an increased diameter portion. A recessed portion which receives the increased diameter portion is in an upper surface of the flange. The increased diameter portion has side walls in contact with or facing respective inner side surfaces of the flange partly, with the inner side surfaces forming the recessed portion, and a bottom wall in contact with an upper recessed surface of the flange that forms the recessed portion. The increased diameter portion has connection surfaces connecting the bottom and side walls and inclined inward from one of the side walls toward the bottom wall. Alternatively, the inner side surfaces each have a first surface inclined downward, and a vertical surface extending downward from the first surface to the upper recessed surface.

20 Claims, 15 Drawing Sheets

(56) References Cited

FOREIGN PATENT DOCUMENTS

| | | |
|---|---|---|
| JP | 2004-247494 A | 9/2004 |
| JP | 2019-138768 A | 8/2019 |
| WO | 2016/072193 A1 | 5/2016 |
| WO | 2018/116568 A1 | 6/2018 |
| WO | 2019/069576 A1 | 4/2019 |

OTHER PUBLICATIONS

Written Opinion issued in PCT/JP2019/044542; dated Jan. 28, 2020.

\* cited by examiner

PROBE FOR CHARACTERISTIC INSPECTION OF A CONNECTOR

CROSS-REFERENCE TO RELATED APPLICATIONS

This application claims benefit of priority to International Patent Application No. PCT/JP2019/044542, filed Nov. 13, 2019, and to Japanese Patent Application No. 2018-216673, filed Nov. 19, 2018, the entire contents of each are incorporated herein by reference.

BACKGROUND

Technical Field

The present disclosure relates to a probe for connectors.

Background Art

A probe for characteristic inspection of connectors that are inspection targets is disclosed in the related art, as described, for example, in International Publication No. 2016/072193.

In particular, the probe in International Publication No. 2016/072193 is used for characteristic inspection of multi-line connectors in which a plurality of terminals are disposed to transmit a plurality of signals. The probe in International Publication No. 2016/072193 includes a plurality of probe pins capable of being simultaneously in contact with respective terminals of a multi-line connector.

SUMMARY

Characteristic inspection with such a probe for connectors is required to have improved accuracy. An attempt to cause a plurality of probe pins to be simultaneously in contact with respective terminals as in the probe in International Publication No. 2016/072193 may result in misalignment between the probe pins and the respective terminals, and the accuracy of characteristic inspection is thus likely to deteriorate. In addition to such a probe disclosed in International Publication No. 2016/072193, there is a demand for developing a technique capable of improving the accuracy of characteristic inspection of a terminal of a connector.

Accordingly, the present disclosure provides a probe capable of improving the accuracy of characteristic inspection of a terminal of a connector.

A probe according to an aspect of the present disclosure is a probe for characteristic inspection of a connector and includes a flange having a through hole disposed so as to extend in a vertical direction; a coaxial cable that is inserted into the through hole and that extends in an axial direction, a probe pin being connected to a tip of the coaxial cable; a plunger that contains the probe pin and at which a tip of the probe pin is exposed; and a housing that has a cylindrical shape and that contains the coaxial cable. An end portion on one side of the housing is configured to be fitted to the flange, and an end portion on another side of the housing is attached to the plunger. The housing includes a body that has a cylindrical shape and that is inserted into the through hole of the flange. The end portion on the one side of the housing includes an increased diameter portion formed by increasing a diameter of the body in horizontal directions. A recessed portion formed by expanding the through hole in the horizontal directions so as to receive the increased diameter portion of the housing is formed in an upper surface of the flange. The increased diameter portion has side walls configured to be in contact with or to face respective inner side surfaces of the flange partly, the inner side surfaces forming the recessed portion, and a bottom wall configured to be in contact with an upper recessed surface of the flange, the upper recessed surface forming the recessed portion. The increased diameter portion has connection surfaces connecting the side walls and the bottom wall, each of the connection surfaces being a surface inclined inward from a corresponding one of the side walls toward the bottom wall, or the inner side surfaces of the flange forming the recessed portion each have a first surface inclined downward and a second surface that is a vertical surface extending downward from the first surface and connected to the upper recessed surface of the flange.

A probe in another aspect of the present disclosure is a probe for characteristic inspection of a connector and includes a flange having a through hole disposed so as to extend in a vertical direction; a coaxial cable that is inserted into the through hole and that extends in an axial direction, a probe pin being connected to a tip of the coaxial cable; a plunger that contains the probe pin and at which a tip of the probe pin is exposed; and a housing that has a cylindrical shape and that contains the coaxial cable. An end portion on one side of the housing is configured to be fitted to the flange, and an end portion on another side of the housing is attached to the plunger. The housing includes a body that has a cylindrical shape and that is inserted into the through hole of the flange. The end portion on the one side of the housing includes an increased diameter portion formed by increasing a diameter of the body in horizontal directions. A recessed portion formed by expanding the through hole in the horizontal directions so as to receive the increased diameter portion of the housing is formed in an upper surface of the flange. The increased diameter portion has side walls configured to be in contact with or to face respective inner side surfaces of the flange partly, with the inner side surfaces forming the recessed portion, and a bottom wall configured to be in contact with an upper recessed surface of the flange, with the upper recessed surface forming the recessed portion. In a state in which the bottom wall of the increased diameter portion is in contact with the upper recessed surface of the flange, a space for moving the increased diameter portion in the horizontal directions is formed between the side walls of the increased diameter portion and the inner side surfaces of the flange.

The probe of the present disclosure is capable of improving the accuracy of characteristic inspection of a terminal of a connector.

DETAILED DESCRIPTION

Figure 1:
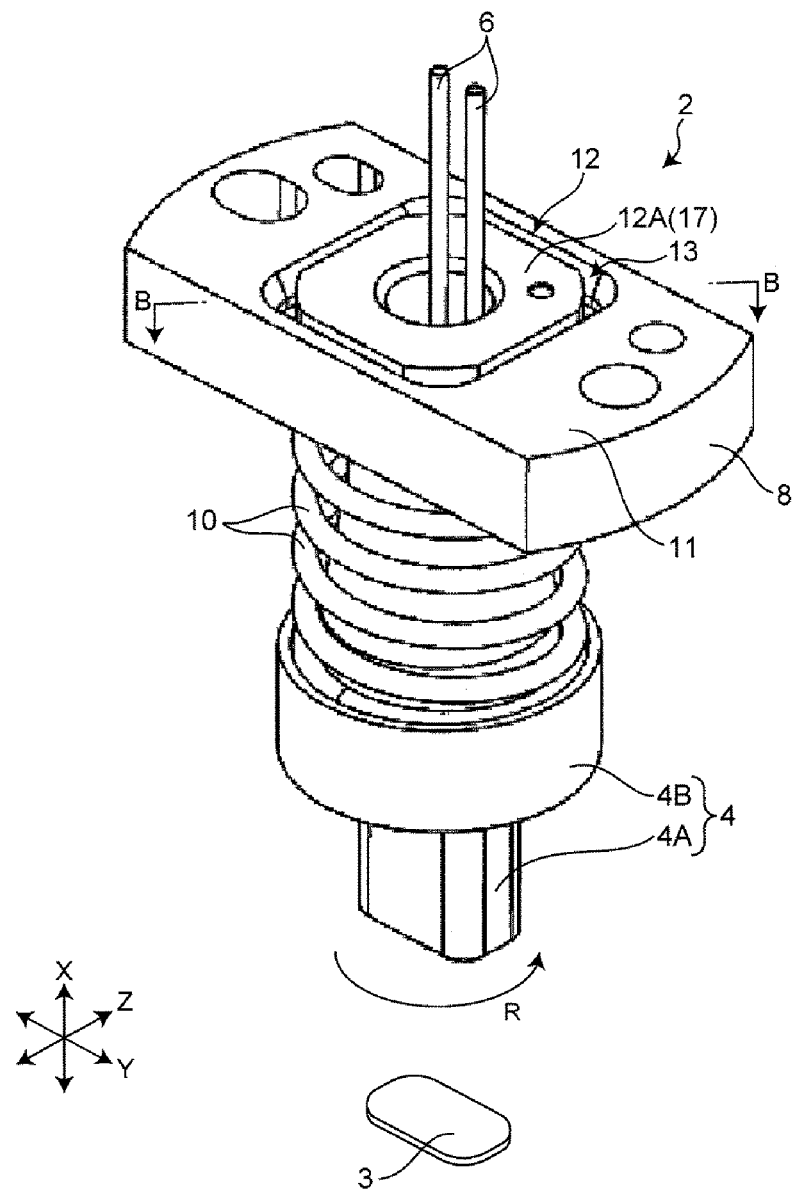
FIG. 1 is a perspective view of a probe in Embodiment 1.

A first aspect of the present disclosure provides a probe for characteristic inspection of a connector. The probe includes a flange having a through hole disposed so as to extend in a vertical direction; a coaxial cable that is inserted into the through hole and that extends in an axial direction, a probe pin being connected to a tip of the coaxial cable; a plunger that contains the probe pin and at which a tip of the probe pin is exposed; and a housing that has a cylindrical shape and that contains the coaxial cable, an end portion on one side of the housing being configured to be fitted to the flange, an end portion on another side of the housing being attached to the plunger. The housing includes a body that has a cylindrical shape and that is inserted into the through hole of the flange. The end portion on the one side of the housing includes an increased diameter portion formed by increasing a diameter of the body in horizontal directions. A recessed portion formed by expanding the through hole in the horizontal directions so as to receive the increased diameter portion of the housing is formed in an upper surface of the flange. The increased diameter portion has side walls configured to be in contact with or to face respective inner side surfaces of the flange partly, the inner side surfaces forming the recessed portion, and a bottom wall configured to be in contact with an upper recessed surface of the flange, the upper recessed surface forming the recessed portion. The increased diameter portion has connection surfaces connecting the side walls and the bottom wall, each of the connection surfaces being a surface inclined inward from a corresponding one of the side walls toward the bottom wall, or the inner side surfaces of the flange forming the recessed portion each have a first surface inclined downward and a second surface that is a vertical surface extending downward from the first surface and connected to the upper recessed surface of the flange. With such a configuration, the verticality of the housing can be ensured by supporting the bottom wall of the increased diameter portion by the upper recessed surface of the flange. The side walls of the increased diameter portion are in contact with or face the respective inner side surfaces of the flange partly. Thus, there is space between the housing and the flange. Accordingly, there is room to move the increased diameter portion in the recessed portion in horizontal directions. The disposition of such space enables the housing to return to the original position within a certain tolerance. As a result of these, the position of the probe can be maintained with more improved accuracy, and the terminals of the connector can be subjected to characteristic inspection with more improved accuracy.

A second aspect of the present disclosure provides a probe for characteristic inspection of a connector, the probe including: a flange having a through hole disposed so as to extend in a vertical direction; a coaxial cable that is inserted into the through hole and that extends in an axial direction, a probe pin being connected to a tip of the coaxial cable; a plunger that contains the probe pin and at which a tip of the probe pin is exposed; and a housing that has a cylindrical shape and that contains the coaxial cable, an end portion on one side of the housing being configured to be fitted to the flange, an end portion on another side of the housing being attached to the plunger. The housing includes a body that has a cylindrical shape and that is inserted into the through hole of the flange. The end portion on the one side of the housing includes an increased diameter portion formed by increasing a diameter of the body in horizontal directions. A recessed portion formed by expanding the through hole in the horizontal directions so as to receive the increased diameter portion of the housing is formed in an upper surface of the flange. The increased diameter portion has side walls configured to be in contact with or to face respective inner side surfaces of the flange partly, the inner side surfaces forming the recessed portion, and a bottom wall configured to be in contact with an upper recessed surface of the flange, the upper recessed surface forming the recessed portion. In a state in which the bottom wall of the increased diameter portion is in contact with the upper recessed surface of the flange, a space for moving the increased diameter portion in the horizontal directions is formed between the side walls of the increased diameter portion and the inner side surfaces of the flange. With such a configuration, the verticality of the housing can be ensured by supporting the bottom wall of the increased diameter portion by the upper recessed surface of the flange. The space for moving the increased diameter portion in the horizontal directions is formed between the increased diameter portion and the flange. Accordingly, there is room to move the increased diameter portion in the recessed portion in the horizontal directions. The disposition of such space enables the housing to return to the original position within a certain tolerance. As a result of these, the position of the probe can be maintained with more improved accuracy, and the terminals of the connector can be subjected to characteristic inspection with more improved accuracy.

A third aspect of the present disclosure provides the probe according to the first or the second aspect, in which the increased diameter portion has connection surfaces connecting the side walls and the bottom wall, each of the connection surfaces being a surface inclined inward from a corresponding one of the side walls toward the bottom wall. With such a configuration, when the housing that has risen from the flange moves downward, and the connection surface of the increased diameter portion of the housing comes into contact with an edge of the recessed portion of the flange, the housing is guided to the inside of the recessed portion by disposing the connection surfaces. As a result, it is possible to return the housing to the original position with improved accuracy and to maintain the position of the probe with more improved accuracy.

A fourth aspect of the present disclosure provides the probe according to the first or the second aspect, in which the inner side surfaces of the flange forming the recessed portion each have a first surface inclined downward, and the vertical surface is a second surface that extends downward from the first surface and that is connected to the upper recessed surface of the flange. With such a configuration, when the housing that has risen from the flange moves downward, and the increased diameter portion of the housing comes into contact with the first surface, the housing is guided to the inside of the recessed portion by disposing the first surfaces inclined downward. As a result, it is possible to return the housing to the original position with improved accuracy and to maintain the position of the probe with more improved accuracy.

A fifth aspect of the present disclosure provides the probe according to any one of the first to the fourth aspects, in which in the increased diameter portion, the side walls are vertical surfaces extending in the vertical direction, and the bottom wall is a horizontal surface extending in the horizontal directions. Such a configuration facilitates formation of the increased diameter portion. The verticality of the housing can be ensured with more improved accuracy by extending the bottom wall in the horizontal directions.

A sixth aspect of the present disclosure provides the probe according to any one of the first to the fifth aspects, in which the upper recessed surface of the flange forming the recessed portion is a horizontal surface extending in the horizontal directions. Such a configuration facilitates formation of the recessed portion and enables the verticality of the housing to be ensured with more improved accuracy.

A seventh aspect of the present disclosure provides the probe according to any one of the first to the sixth aspects, in which the bottom wall of the increased diameter portion and the upper recessed surface of the flange forming the recessed portion are flat. Such a configuration enables the verticality of the housing to be ensured with more improved accuracy. In addition, the bottom wall of the increased diameter portion and the upper recessed surface of the flange are flat, and the increased diameter portion of the housing thus can move freely in horizontal directions when the bottom wall of the increased diameter portion and the upper recessed surface of the flange are in contact with each other. As a result, it is possible to return the housing to the original position with improved accuracy and to maintain the position of the probe with more improved accuracy.

An eighth aspect of the present disclosure provides the probe according to any one of the first to the seventh aspects, further including an elastic component configured to urge the flange and the plunger in respective directions away from each other, one end of the elastic component being attached to a position facing the recessed portion in a lower surface of the flange, another end of the elastic component being attached to the plunger. With such a configuration, an elastic component urges the flange and the plunger in respective directions away from each other, and the increased diameter portion of the housing thus can be guided to and housed in the recessed portion of the flange. In addition, when the connector is fitted to the bottom of the plunger, it is possible to push the probe pin against a terminal of the connector with an appropriate load.

Embodiments according to the present disclosure will be described below in detail with reference to the drawings.

Embodiment 1

Figure 2:
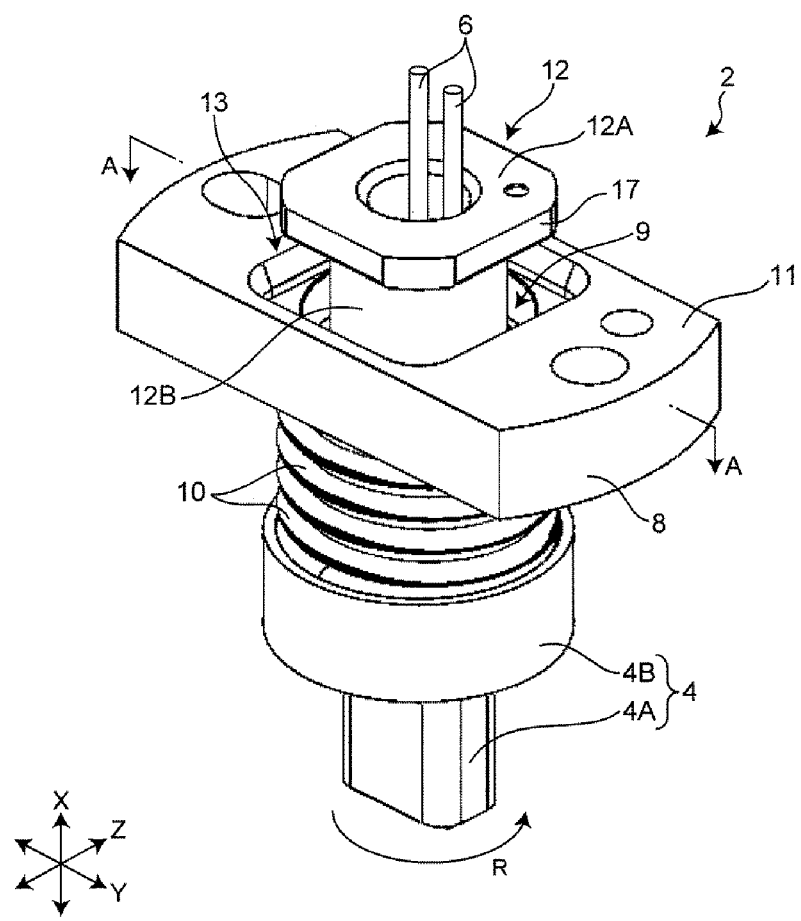
FIG. 2 is a perspective view of the probe in Embodiment 1.
Figure 3:
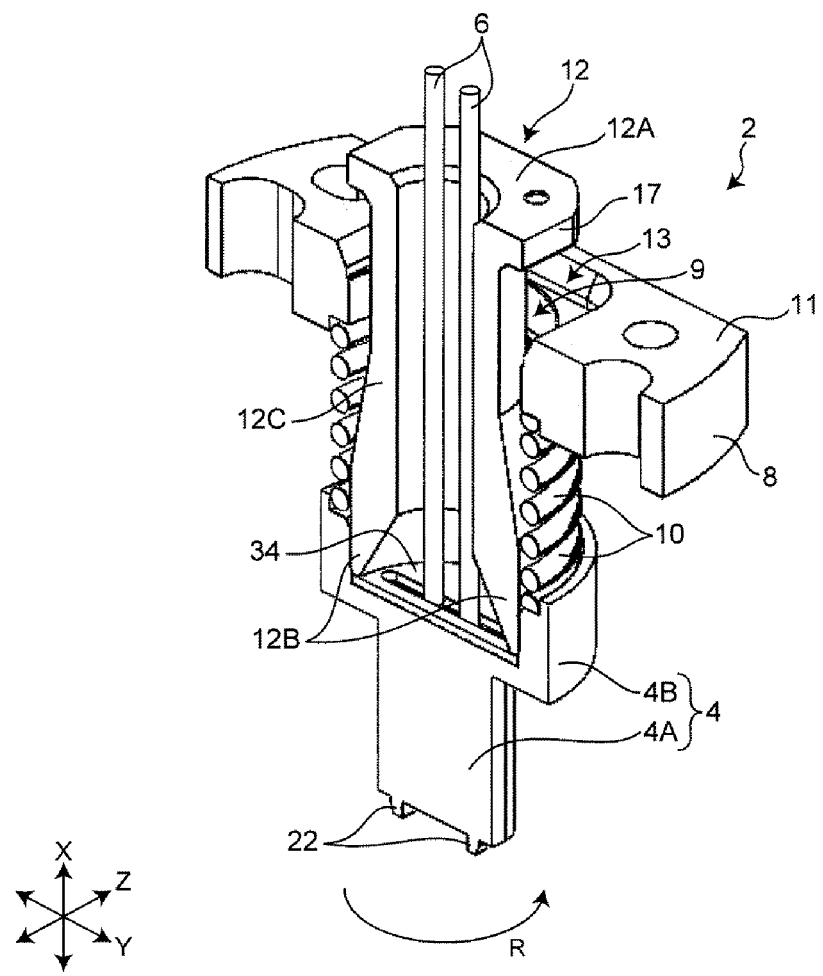
FIG. 3 is a cutaway perspective view illustrating section A-A in FIG. 2.
Figure 4:
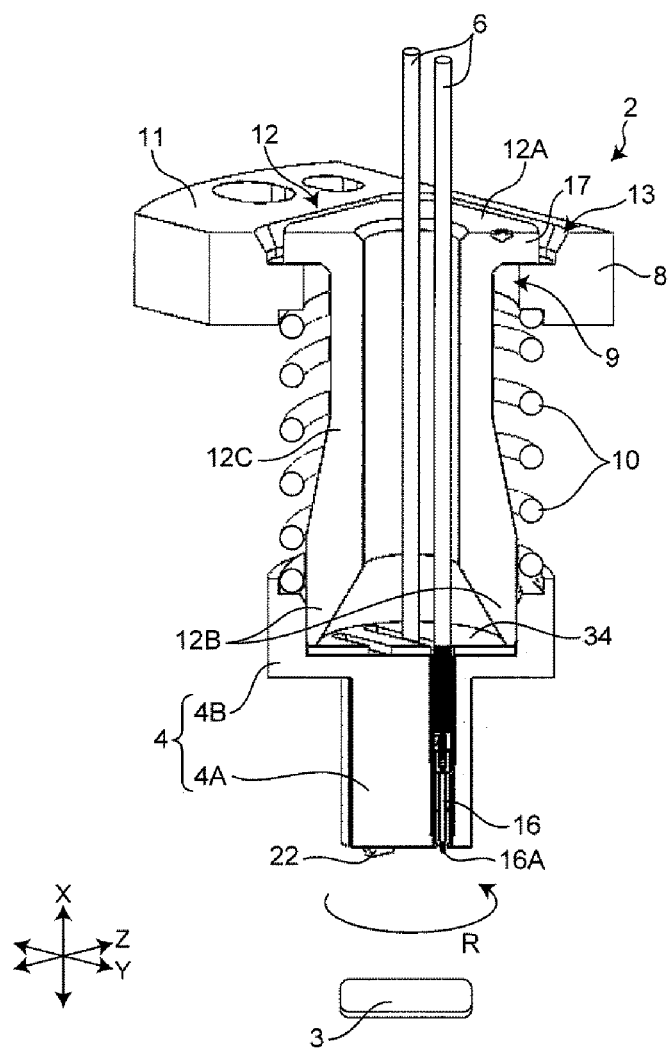
FIG. 4 is a cutaway perspective view illustrating section B-B in FIG. 1.
Figure 5:
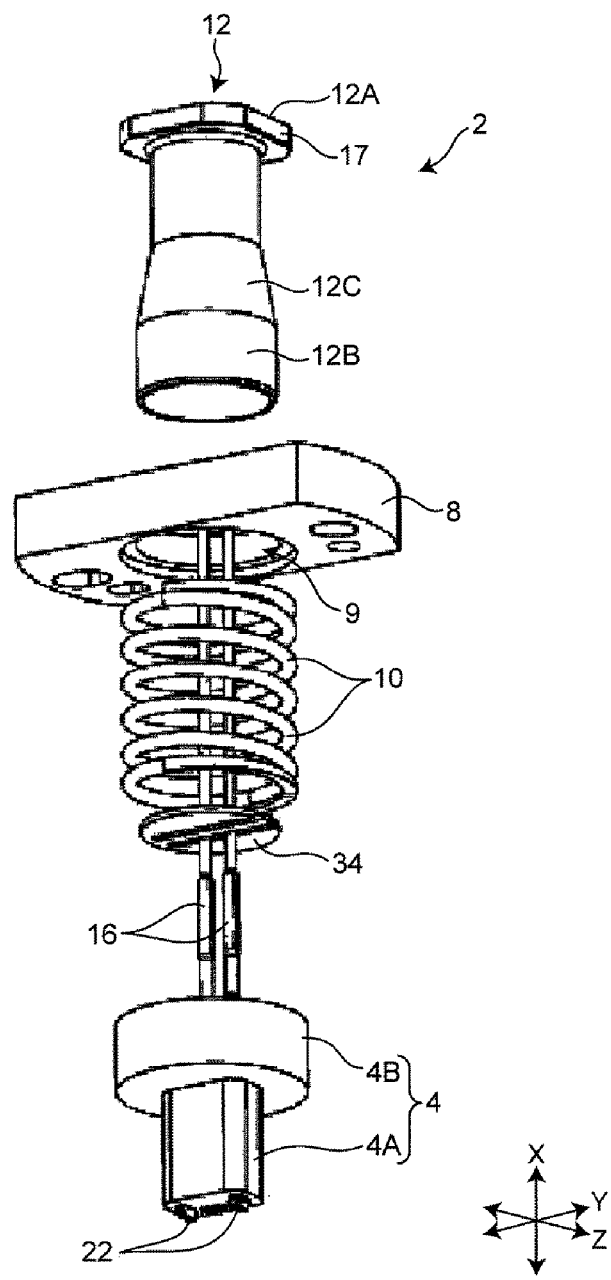
FIG. 5 is an exploded perspective view of the probe in Embodiment 1.

FIGS. 1 to 5 are schematic configuration diagrams of a probe 2 in Embodiment 1. FIGS. 1 and 2 are schematic perspective views illustrating different states of the probe 2. FIG. 3 is a cutaway view illustrating section A-A in FIG. 2. FIG. 4 is a cutaway view illustrating section B-B in FIG. 1. FIG. 5 is an exploded perspective view of the probe 2. In FIGS. 1 to 5, a vertical direction is set as the X direction, and horizontal directions orthogonal to each other are set as the Y direction and the Z direction.

The probe 2 is an inspection device for characteristic inspection of a connector 3. The connector 3 in Embodiment 1 is a multi-line connector including a plurality of terminals. The probe 2 includes a plunger 4, coaxial cables 6, a flange 8, a spring 10, a housing 12, probe pins 16 (FIGS. 4 and 5), and a plate 34.

The plunger 4 is a positioning component for fitting the connector 3 thereto to perform positioning of the connector 3. The plunger 4 includes a fitting portion 4A, to which the connector 3 is fitted, and a cylindrical portion 4B, which is formed into a cylinder. The fitting portion 4A is a part projecting downward from an end portion of the cylindrical portion 4B. Projections 22 (FIGS. 3 to 5) for fitting the connector 3 thereto are formed on the fitting portion 4A.

FIGS. 1 and 4 each illustrate a state in which the connector 3 is yet to be fitted to the fitting portion 4A. FIGS. 2 and 3 each illustrate a state in which the connector 3 has been fitted to the fitting portion 4A. FIGS. 2 and 3 do not illustrate the connector 3 for convenience.

As illustrated in FIGS. 3 and 4, the coaxial cables 6 are inserted into the housing 12.

The coaxial cables 6 are components for being electrically continuous with terminals of the connector 3. The coaxial cables 6 are each formed into a rod shape. The probe pins 16 are electrically coupled to tips of the coaxial cables 6. Each of the probe pins 16 is coupled to a corresponding one of the coaxial cables 6.

The probe pins 16 are rod-shaped components configured to be in contact with and electrically continuous with respective terminals of the connector 3. Each inner side portion of the probe pins 16 is made of a conductive material, and each outer side portion of the probe pins 16 is made of an insulating material. The probe pins 16 are press fitted into and fixed to the plunger 4. Tips 16A of the probe pins 16 are conductive parts. As illustrated in FIG. 4, the tips 16A are exposed at the bottom of the fitting portion 4A and are capable of being in contact with respective terminals of the connector 3.

In particular, in Embodiment 1, the plurality of coaxial cables 6 and probe pins 16 are disposed in the one probe 2. Even when the connector 3, which is an inspection target, is a multi-line connector including a plurality of terminals, such a configuration enables respective terminals of the connector 3 to be simultaneously subjected to characteristic inspection.

Hitherto, coaxial connectors including only one terminal have been mainly used for, for example, connecting RF signal lines inside a mobile phone or a smartphone. In recent years, RF signals in a plurality of bands have been used, and accordingly a plurality of coaxial connectors corresponding to a plurality of RF signal lines are used by being arranged side by side. Due to increasing circuit density, circuits are designed such that, instead of using a coaxial connector, RF signals are transmitted to some terminals of a multi-line connector having a different shape to achieve space savings or other purposes. In response to this, the probe 2 in Embodiment 1 is capable of functioning as a measuring probe with which a plurality of lines can be simultaneously subjected to characteristic inspection by the probe being simultaneously connected to a plurality of terminals of the connector 3.

The flange 8 is a component for attaching the probe 2 to a predetermined apparatus. The predetermined apparatus is, for example, a sorter for sorting, on the basis of results of characteristic inspection of the connector 3, printed circuit boards on which the connector 3 is mounted.

As illustrated in FIGS. 2 and 3, a through hole 9 for inserting the housing 12 thereinto is disposed at the center of the flange 8. The flange 8 is disposed so as to extend in a horizontal direction. The through hole 9 is disposed so as to extend in the vertical direction. The through hole 9 in Embodiment 1 has a cylindrical shape.

A recessed portion 13 for receiving the housing 12 is formed in an upper surface 11 of the flange 8. The recessed portion 13 is disposed as a part formed by expanding the through hole 9 in horizontal directions in the upper surface 11 of the flange 8. The through hole 9 and the recessed portion 13 are formed so as to be spatially continuous with each other. The relationship between the recessed portion 13 and the housing 12 and the specific shapes of the recessed portion 13 and the housing 12 will be described later.

The spring 10 is an elastic component for pushing the probe pins 16 against respective terminals of the connector 3 with an appropriate load. The spring 10 is attached to the periphery of the housing 12. As illustrated in FIGS. 3 and 4, the end portion on one side (upper side) of the spring 10 is press fitted into and attached to a lower surface of the flange 8, and the end portion on the other side (lower side) of the spring 10 is press fitted into and attached to the cylindrical portion 4B of the plunger 4.

In a state in which the connector 3 is yet to be fitted to the fitting portion 4A as illustrated in FIGS. 1 and 4, the spring 10 is shorter than the equilibrium length thereof. That is, the spring 10 is in a compressed state. The spring 10 in a compressed state urges the flange 8 at an upper position and the plunger 4 at a lower position in respective directions away from each other.

The housing 12 is a cylindrical component containing the coaxial cables 6. The housing 12 includes an end portion 12A, which is on one side (upper side), an end portion 12B, which is on the other side (lower side), and a body 12C, which has a cylindrical shape. The end portion 12A on the one side includes an increased diameter portion 17, which is formed by increasing the diameter of the body 12C in horizontal directions. The increased diameter portion 17 is a part housed in the recessed portion 13 of the flange 8. The end portion 12B on the other side is press fitted into and attached to the cylindrical portion 4B of the plunger 4.

The plate 34 is a component for preventing the coaxial cables 6 from being detached upward. The plate 34 is disposed in the cylindrical portion 4B of the plunger 4 between the end portion 12B on the other side of the housing 12 and the plunger 4.

In a state in which the end portion 12B on the other side of the housing 12 is attached to the plunger 4 via the plate 34, the housing 12 and the plunger 4 are integrally rotatable in a circumferential direction R.

The operation of the probe 2 having the above configuration is schematically described with reference to FIGS. 1 to 4.

In the initial state illustrated in FIGS. 1 and 4, the connector 3 is not in contact with the fitting portion 4A of the plunger 4. In this case, an upward vertical load of the connector 3 does not act on the probe 2. As described above, the spring 10 is in a compressed state in which the spring 10 is shorter than the equilibrium length thereof, and the flange 8 and the plunger 4 are urged in respective directions away from each other. As a result, the housing 12 attached to the plunger 4 is urged downward together with the plunger 4. As illustrated in FIGS. 1 and 4, the increased diameter portion 17 of the housing 12 is housed in the recessed portion 13 of the flange 8. The increased diameter portion 17 of the housing 12 is supported by the flange 8 in the recessed portion 13. As a result, the verticality of the housing 12 is maintained.

Next, the connector 3 is fitted to the fitting portion 4A. The connector 3 is positioned by the projections 22 of the fitting portion 4A entering a space formed in the connector 3. Simultaneously, the tips 16A of the probe pins 16 exposed at the bottom of the fitting portion 4A come into contact with terminals of the connector 3. In Embodiment 1, the respective tips 16A of the two probe pins 16 come into contact with two terminals of the connector 3. The coaxial cables 6 are electrically coupled to respective terminals of the connector 3 via the probe pins 16, and the terminals of the connector 3 can be subjected to characteristic inspection.

In this case, the plunger 4 is pushed upward by the connector 3. When a vertical load of the connector 3 equal to or more than a predetermined load is applied to the plunger 4, the spring 10 connected to the plunger 4 contracts. Specifically, the spring 10 in a state of being shorter than the equilibrium length thereof further contracts. The contraction of the spring 10 integrally moves the plunger 4 and the housing 12 upward relative to the flange 8 fixed at a predetermined position. As illustrated in FIGS. 2 and 3, the increased diameter portion 17 of the housing 12 rises from the recessed portion 13, and the housing 12 is thus not in contact with the flange 8.

As described above, the housing 12 and the plunger 4 are integrally rotatable in the direction R. The plunger 4 and the housing 12 that has risen from the flange 8 rotate according to the positions of terminals of the connector 3. Thus, the positions of the plunger 4 and the probe pins 16 are corrected. As a result, the terminals of the connector 3 can be subjected to characteristic inspection with more improved accuracy.

When characteristic inspection is finished, the connector 3 is left at a lower position, and the connector 3 and the fitting portion 4A are released from each other. There is no upward vertical load of the connector 3 acting on the plunger 4, and the spring 10 thus stretches so as to be in the original state thereof. As illustrated in FIGS. 1 and 4, the housing 12 moves downward relative to the flange 8, and the increased diameter portion 17 of the housing 12 is housed in the recessed portion 13 of the flange 8.

When the increased diameter portion 17 of the housing 12 is housed in the recessed portion 13 of the flange 8, it is preferable to return the increased diameter portion 17 of the housing 12 to the same position such that the deviation from the position is as small as possible. In the probe 2 in Embodiment 1, the shapes of the recessed portion 13 and the increased diameter portion 17 are devised to return the housing 12 to the original position such that the deviation from the position is within a predetermined tolerance. The specific description thereof is given with reference to FIGS. 6A to 6C, 7A to 7C, and 8A to 8C.

Figure 6A:
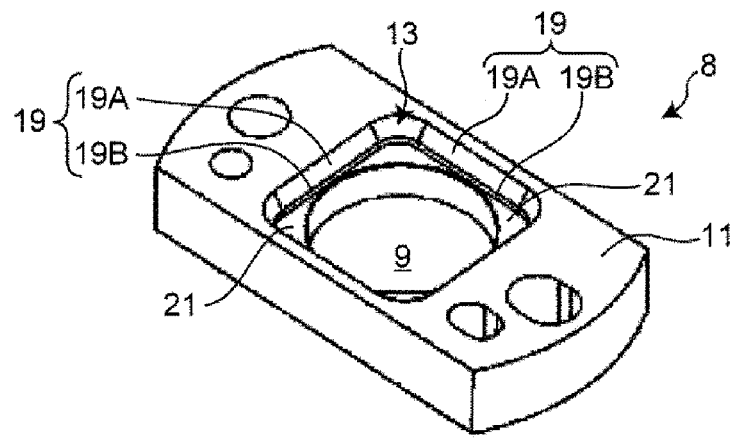
FIG. 6A is a perspective view of a flange in Embodiment 1.
Figure 6B:
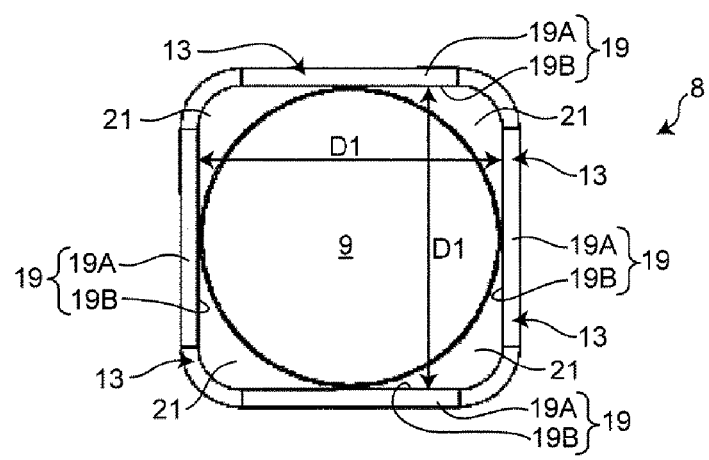
FIG. 6B is a plan view of the flange in Embodiment 1.
Figure 6C:
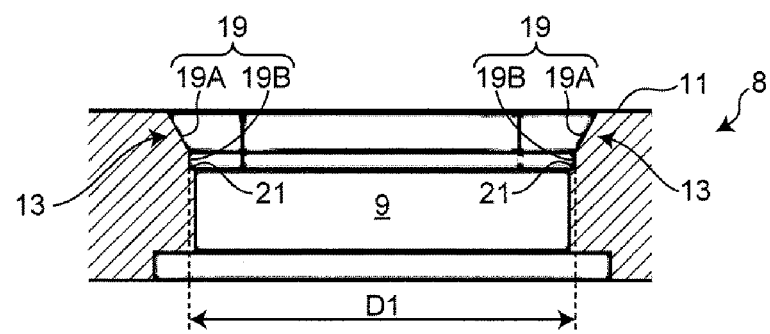
FIG. 6C is a longitudinal sectional view of the flange in Embodiment 1.
Figure 7A:
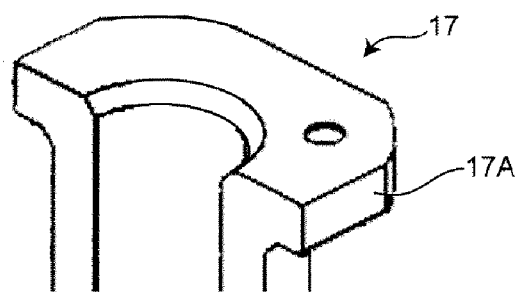
FIG. 7A is a perspective view of a housing in Embodiment 1.
Figure 7B:
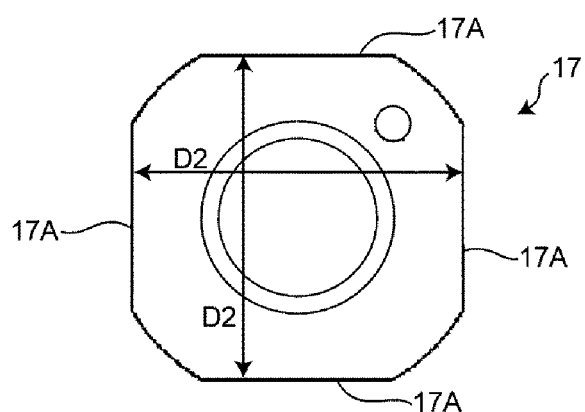
FIG. 7B is a plan view of the housing in Embodiment 1.
Figure 7C:
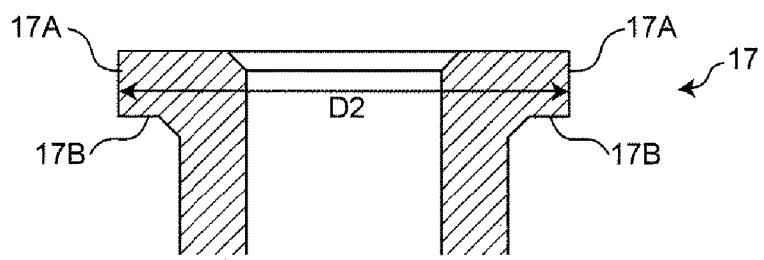
FIG. 7C is a longitudinal sectional view of the housing in Embodiment 1.

FIGS. 6A to 6C are a perspective view, a plan view, and a longitudinal sectional view of the flange 8, respectively. FIGS. 7A to 7C are a perspective view, a plan view, and a longitudinal sectional view of the increased diameter portion 17 of the housing 12, respectively.

As illustrated in FIGS. 6A to 6C, the flange 8 has inner side surfaces 19 and an upper recessed surface 21, which serve as surfaces forming the recessed portion 13.

The inner side surfaces 19 each have a first surface 19A and a second surface 19B. The first surface 19A is a surface inclined downward from the upper surface 11 of the flange 8. The second surface 19B is a surface connected to the lower side of the first surface 19A and extending downward from the first surface 19A. The second surface 19B in Embodiment 1 is a vertical surface extending in the vertical direction. Both the first surface 19A and the second surface 19B are flat.

In Embodiment 1, as illustrated in FIG. 6B, the inner side surfaces 19 are formed so as to have a substantially square shape in plan view. A pair of inner side surfaces 19 are disposed at respective positions facing each other, and two pairs of inner side surfaces 19 are disposed so as to have a substantially square shape. Adjacent inner side surfaces 19 are orthogonal to each other in plan view.

As illustrated in FIG. 6B, a distance D1 between a pair of inner side surfaces 19 facing each other (second surfaces 19B) is set to a predetermined length. Specifically, the distance D1 is set to a length in which the increased diameter portion 17 (described later) of the housing 12 can be housed.

The upper recessed surface 21 is a surface connected to the lower side of each of the second surfaces 19B and extending in horizontal directions from the second surfaces 19B. The upper recessed surface 21 is formed so as to extend to positions adjacent to the through hole 9. The upper recessed surface 21 in Embodiment 1 is flat and a horizontal surface extending in horizontal directions. The upper recessed surface 21 may be regarded as a component forming a part of the upper surface 11 of the flange 8.

When the increased diameter portion 17 of the housing 12 moves downward toward the recessed portion 13 of the flange 8, and an edge of the increased diameter portion 17 comes into contact with the first surface 19A, the increased diameter portion 17 is guided inward toward the recessed portion 13 by inclining the first surface 19A downward. As a result, the increased diameter portion 17 can be housed in the recessed portion 13 with improved accuracy. The increased diameter portion 17 disposed in the recessed portion 13 is supported by the upper recessed surface 21. The disposition of the upper recessed surface 21 enables the increased diameter portion 17 to be supported and enables the position of the housing 12 to be maintained in a predetermined position (that is, enables the verticality of the housing 12 to be ensured).

As illustrated in FIGS. 7A to 7C, the increased diameter portion 17 has side walls 17A and a bottom wall 17B. The side walls 17A are surfaces disposed so as to face the respective inner side surfaces 19 of the flange 8. The bottom wall 17B is a surface supported by the upper recessed surface 21 of the flange 8. In Embodiment 1, the side walls 17A are vertical surfaces extending in the vertical direction, and the bottom wall 17B is a horizontal surface extending in horizontal directions.

In Embodiment 1, as illustrated in FIG. 7B, the side walls 17A are formed so as to have a substantially square shape in plan view. A pair of side walls 17A are disposed at respective positions facing each other, and two pairs of side walls 17A are disposed so as to have a substantially square shape. Adjacent side walls 17A are orthogonal to each other in plan view.

As illustrated in FIGS. 7B and 7C, a distance D2 between a pair of side walls 17A facing each other is set to be slightly smaller than the distance D1 between side walls 19B of the flange 8. Such a distance setting enables the increased diameter portion 17 to be disposed in the region surrounded by the second surfaces 19B of the inner side surfaces 19.

Figure 8A:
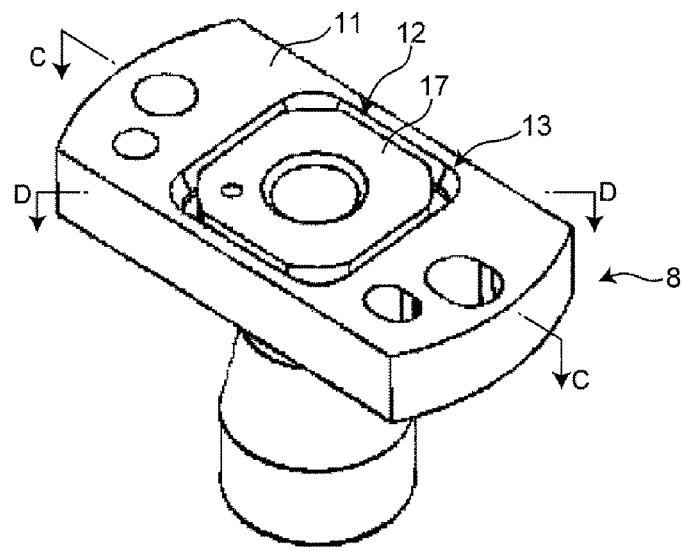
FIG. 8A is a perspective view in which the flange and the housing in Embodiment 1 are in contact with each other.
Figure 8B:
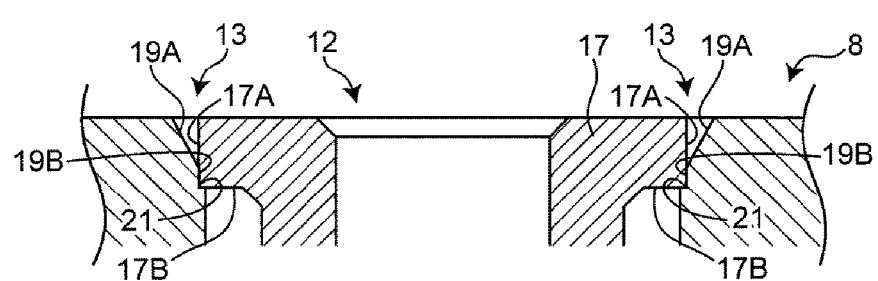
FIG. 8B is a sectional view of section C-C in FIG. 8A.
Figure 8C:
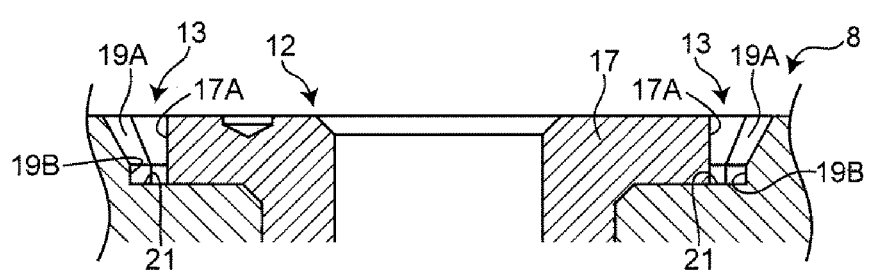
FIG. 8C is a sectional view of section D-D in FIG. 8A.
Figure 8D:
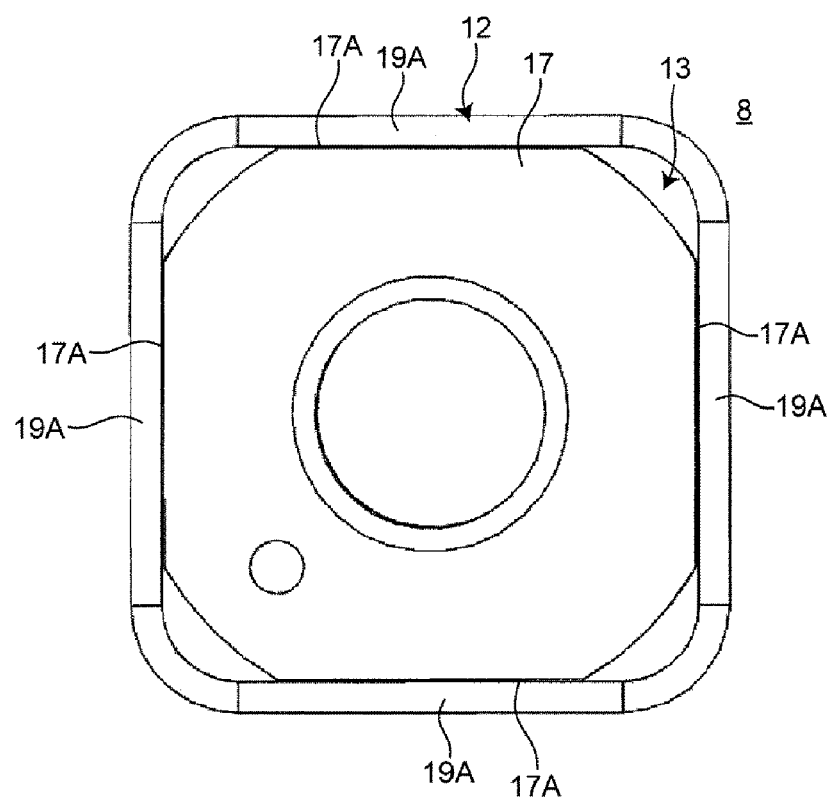
FIG. 8D is a plan view in which the flange and the housing in Embodiment 1 are in contact with each other.

The state in which the increased diameter portion 17 is housed in the recessed portion 13 of the flange 8 is described with reference to FIGS. 8A to 8D. FIGS. 8A and 8D are a perspective view and a plan view, respectively, in which the increased diameter portion 17 is in contact with the flange 8. FIG. 8B is a sectional view of section C-C in FIG. 8A. FIG. 8C is a sectional view of section D-D in FIG. 8A.

In the section illustrated in FIG. 8B, the side walls 17A of the increased diameter portion 17 and the inner side surfaces 19 (in particular, the second surfaces 19B) of the flange 8 are in contact with or face each other partly. As described above, the distance D1 is set to be slightly larger than the distance D2. Thus, the side walls 17A of the increased diameter portion 17 and the second surfaces 19B of the flange 8 are not entirely in contact with each other but are partly in contact with each other or face each other with space therebetween. The increased diameter portion 17 is slightly movable in horizontal directions in the region limited and surrounded by the second surfaces 19B when being housed in the recessed portion 13, but the distance covered thereby is limited. The positional deviation of the increased diameter portion 17 in the recessed portion 13 in horizontal directions can be limited to be within a desired tolerance by appropriately setting the distance D1 between the inner side surfaces 19 of the flange 8 according to the distance D2 between the side walls 17A of the increased diameter portion 17. As a result, the positional deviation of the housing 12 in horizontal directions can be as small as possible with appropriate clearance in horizontal directions in the case in which the housing 12 is housed in the recessed portion 13.

On the other hand, the first surfaces 19A disposed at the inner side surfaces 19 of the flange 8 are inclined surfaces and are likely to vary in shape due to being more difficult to form than vertical surfaces. In response to this, in the probe 2 in Embodiment 1, the first surfaces 19A guide the increased diameter portion 17 of the housing 12 to the recessed portion 13 and do not support the increased diameter portion 17. The increased diameter portion 17 is supported by the upper recessed surface 21. This configuration enables the position in which the housing 12 is supported not to be affected by variations in the shapes of the first surfaces 19A.

In addition to the first surfaces 19A, the second surfaces 19B, which are vertical surfaces, are formed in the probe 2 in Embodiment 1. Vertical surfaces are unlikely to vary in shape due to being easier to form than inclined surfaces. The positional deviation of the increased diameter portion 17 in horizontal directions can be limited with improved accuracy by surrounding the increased diameter portion 17 housed in the recessed portion 13 in horizontal directions with the second surfaces 19B each formed by a vertical surface.

In the section illustrated in FIG. 8C, the side walls 17A of the increased diameter portion 17 and the respective inner side surfaces 19 of the flange 8 are not in contact with each other but face each other with space therebetween.

As described above, the probe 2 in Embodiment 1 is a probe for characteristic inspection of the connector 3 and includes the plunger 4, the coaxial cables 6, the flange 8, and the housing 12. The flange 8 is a component for attaching the probe 2 to an apparatus and has the through hole 9, which is disposed so as to extend in the vertical direction. The coaxial cables 6 are components that are inserted into the through hole 9 and that extend in the axial direction, and the probe pins 16 are connected to the respective tips thereof. The plunger 4 is a component that contains the probe pins 16 and at which the tips 16A of the probe pins 16 are exposed. The housing 12 is a component in which the end portion 12A on the one side is configured to be fitted to the flange 8 and the end portion 12B on the other side is attached to the plunger 4.

In the above configuration, the housing 12 includes the body 12C, which has a cylindrical shape and is inserted into the through hole 9 of the flange 8. The end portion 12A on the one side of the housing 12 includes the increased diameter portion 17, which is formed by increasing the diameter of the body 12C in horizontal directions. The recessed portion 13, which is formed by expanding the through hole 9 in horizontal directions so as to receive the increased diameter portion 17 of the housing 12, is formed in the upper surface 11 of the flange 8. The increased diameter portion 17 has the side walls 17A, which are in contact with or face the respective inner side surfaces 19 of the flange 8 partly, and the bottom wall 17B, which is in contact with the upper recessed surface 21 of the flange 8. The inner side surfaces 19 of the flange 8 each have the first surface 19A, which is inclined downward, and the second surface 19B, which is a vertical surface extending downward from the first surface 19A and connected to the upper recessed surface 21 of the flange 8.

With such a configuration, the verticality of the housing 12 can be ensured by supporting the bottom wall 17B of the increased diameter portion 17 by the upper recessed surface 21 of the flange 8. The side walls 17A of the increased diameter portion 17 are in contact with or face the respective inner side surfaces 19 of the flange 8 partly. Thus, there is space between the housing 12 and the flange 8. Accordingly, there is room to move the increased diameter portion 17 in the recessed portion 13 in horizontal directions. When the housing 12 away from the flange 8 returns to the recessed portion 13, the disposition of such space enables the housing 12 to be easily disposed in the recessed portion 13 and enables the position of the housing 12 in horizontal directions to be within a certain tolerance. As a result of these, the position of the probe 2 before and after inspection of the connector 3 can be maintained with more improved accuracy, and the terminals of the connector 3 can be subjected to characteristic inspection with more improved accuracy.

When the housing 12 that has risen from the flange 8 moves downward, and the increased diameter portion 17 of the housing 12 comes into contact with the first surface 19A, the housing 12 is guided to the inside of the recessed portion 13 by disposing the first surfaces 19A, which are inclined downward, at the inner side surfaces 19 of the flange 8. As a result, it is possible to return the housing 12 to the original position with improved accuracy and to maintain the position of the probe 2 with more improved accuracy.

In the probe 2 in Embodiment 1, in the increased diameter portion 17, the side walls 17A are vertical surfaces extending in the vertical direction, and the bottom wall 17B is a horizontal surface extending in horizontal directions. Such a configuration facilitates formation of the increased diameter portion 17. The verticality of the housing 12 can be ensured with more improved accuracy by extending the bottom wall 17B in horizontal directions.

In the probe 2 in Embodiment 1, the upper recessed surface 21 of the flange 8 is a horizontal surface extending in horizontal directions. Such a configuration facilitates formation of the recessed portion 13 and enables the verticality of the housing 12 to be ensured with more improved accuracy.

In the probe 2 in Embodiment 1, the bottom wall 17B of the increased diameter portion 17 and the upper recessed surface 21 of the flange 8 are flat. Such a configuration enables the verticality of the housing 12 to be ensured with more improved accuracy.

In the probe 2 in Embodiment 1, the second surfaces 19B, which are vertical surfaces, are disposed at the respective inner side surfaces 19 of the flange 8. As a result, it is possible to improve the accuracy in forming the recessed portion 13 in the flange 8 compared with the case in which all the inner side surfaces 19 are inclined surfaces.

Embodiment 2

A probe 40 in Embodiment 2 according to the present disclosure is described with reference to FIGS. 9 to 16B. In Embodiment 2, points of difference between Embodiment 1 and Embodiment 2 are mainly described.

Figure 9:
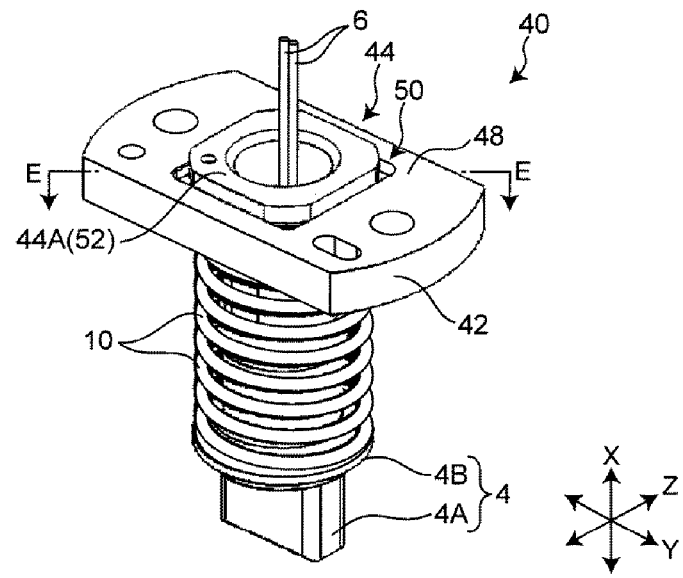
FIG. 9 is a perspective view of a probe in Embodiment 2.
Figure 10:
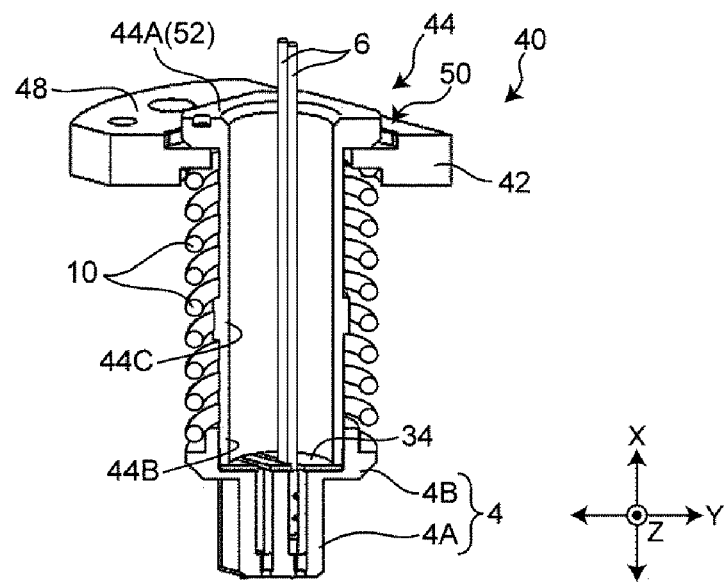
FIG. 10 is a cutaway perspective view illustrating section E-E in FIG. 9.
Figure 11:
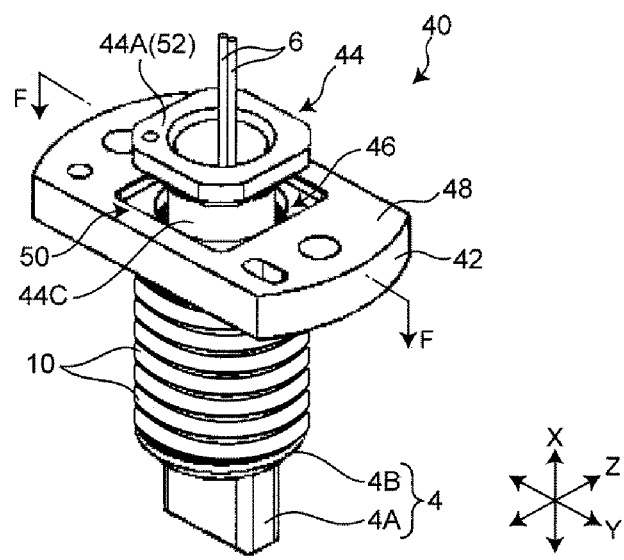
FIG. 11 is a perspective view of the probe in Embodiment 2.
Figure 12:
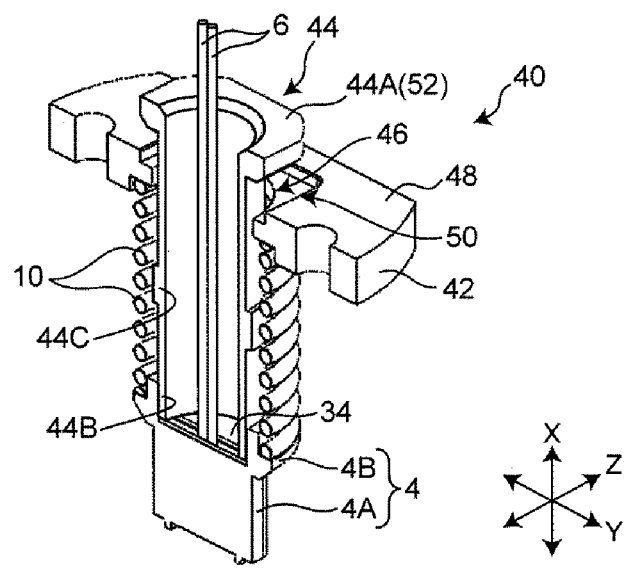
FIG. 12 is a cutaway perspective view illustrating section F-F in FIG. 11.
Figure 13:
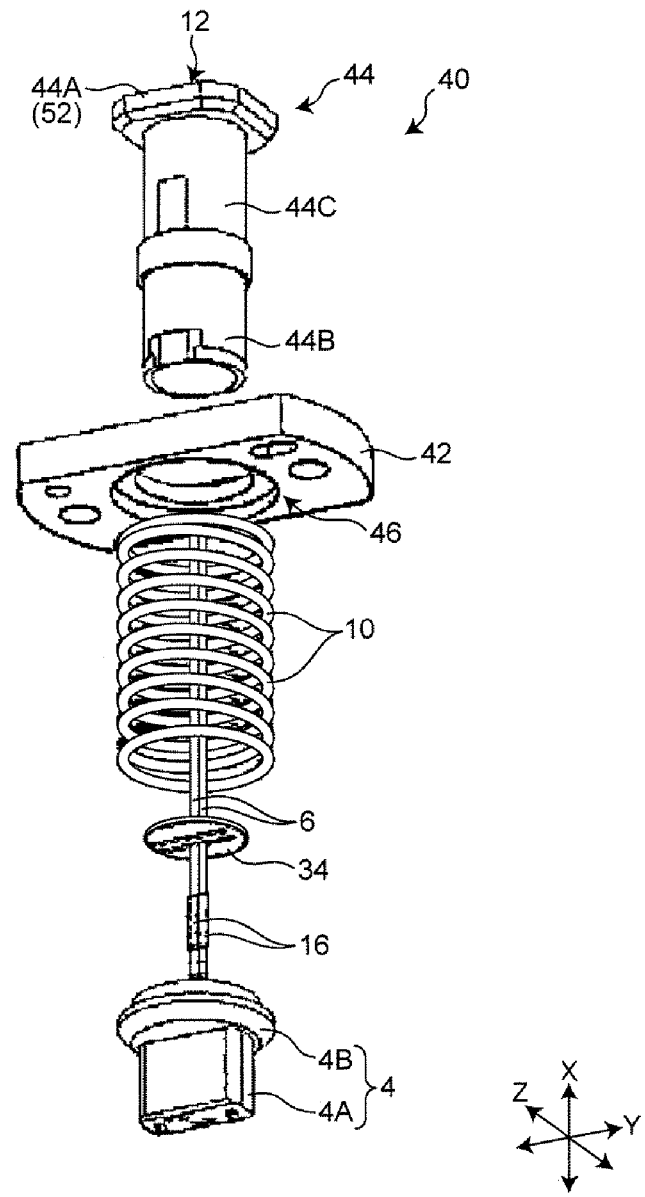
FIG. 13 is an exploded perspective view of the probe in Embodiment 2.

FIGS. 9 to 13 are schematic configuration diagrams of the probe 40 in Embodiment 2. FIGS. 9 and 11 are schematic perspective views illustrating different states of the probe 2. FIG. 10 is a sectional view of section E-E in FIG. 9. FIG. 12 is a sectional view of section F-F in FIG. 11. FIG. 13 is an exploded perspective view of the probe 40. Also in FIGS. 9 to 13, a vertical direction is set as the X direction, and horizontal directions orthogonal to each other are set as the Y direction and the Z direction.

The probe 40 in Embodiment 2 includes the plunger 4, the coaxial cables 6, the spring 10, which are the same components as in Embodiment 1, a flange 42, and a housing 44, which are components different from the components in Embodiment 1. Hereinafter, the flange 42 and the housing 44 are mainly described.

As illustrated in FIGS. 11 and 12, a through hole 46 for inserting the housing 44 thereinto is disposed at the center of the flange 42. A recessed portion 50 is formed in an upper surface 48 of the flange 42. The recessed portion 50 is a part formed by expanding the through hole 46 in horizontal directions in the upper surface 48 of the flange 42.

The housing 44 includes an end portion 44A, which is on one side (upper side), an end portion 44B, which is on the other side (lower side), and a body 44C, which has a cylindrical shape. The end portion 44A on the one side includes an increased diameter portion 52, which is formed by increasing the diameter of the body 44C in horizontal directions. The increased diameter portion 52 is a part housed in the recessed portion 50 of the flange 42.

Next, the shapes of the recessed portion 50 and the increased diameter portion 52 are described with reference to FIGS. 14A to 14C, 15A to 15D, 16A, and 16B.

Figure 14A:
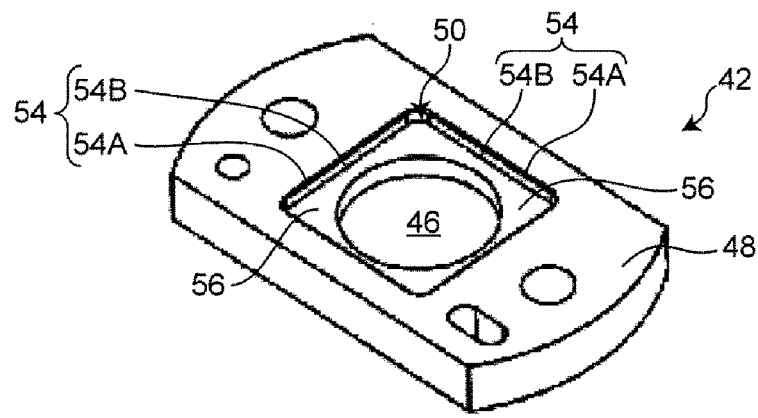
FIG. 14A is a perspective view of a flange in Embodiment 2.
Figure 14B:
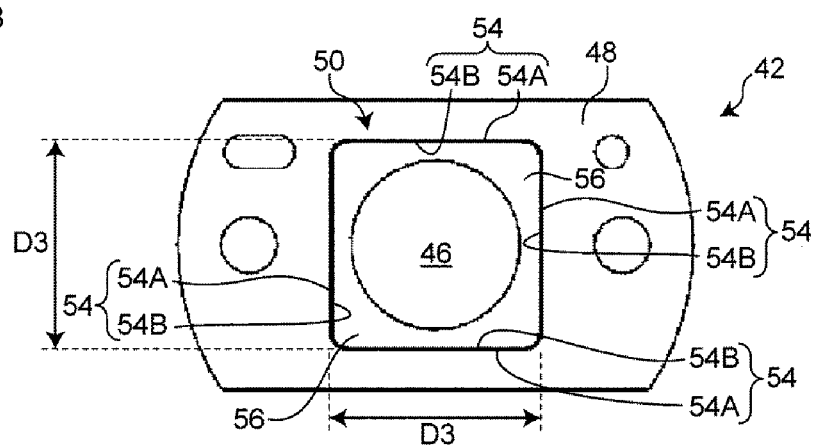
FIG. 14B is a plan view of the flange in Embodiment 2.
Figure 14C:
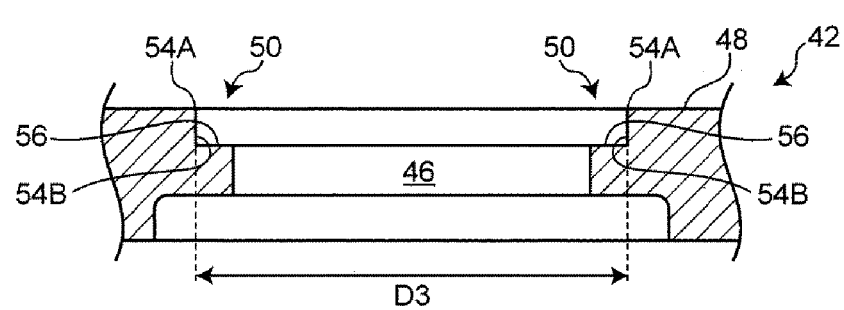
FIG. 14C is a longitudinal sectional view of the flange in Embodiment 2.

FIGS. 14A to 14C are a perspective view, a plan view, and a longitudinal sectional view of the flange 42, respectively. FIGS. 15A to 15D are an upper perspective view, a lower perspective view, a plan view, and a longitudinal sectional view of the increased diameter portion 17, respectively.

As illustrated in FIGS. 14A to 14C, the flange 42 has inner side surfaces 54 and an upper recessed surface 56, which serve as surfaces forming the recessed portion 50.

The inner side surfaces 54 each have a first surface 54A and a second surface 54B. The first surface 54A is a surface inclined downward from the upper surface 48 of the flange 42. Unlike Embodiment 1, the first surface 54A is formed only in a small region. The second surface 54B is a surface extending downward from the first surface 54A. The second surface 54B is a vertical surface extending in the vertical direction. Both the first surface 54A and the second surface 54B are flat surfaces.

As illustrated in FIGS. 14B and 14C, a distance D3 between a pair of inner side surfaces 54 facing each other (second surfaces 54B) is set to a length in which the increased diameter portion 52 (described later) can be housed.

The upper recessed surface 56, which forms the recessed portion 50, is a surface extending in horizontal directions from the second surfaces 54B. The upper recessed surface 56 is formed so as to extend to positions adjacent to the through hole 46. Similarly to Embodiment 1, the upper recessed surface 56 is flat and a horizontal surface extending in horizontal directions.

Next, the increased diameter portion 52 of the housing 44 is described with reference to FIGS. 15A to 15D.

Figure 15A:
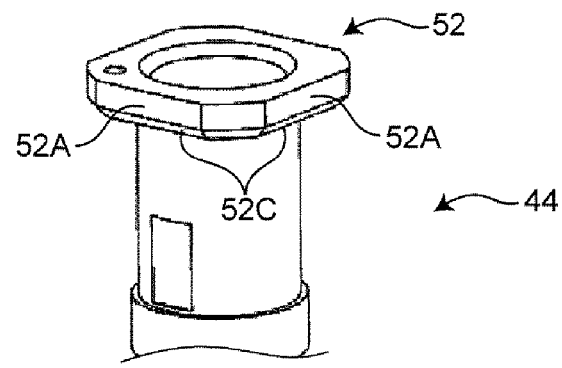
FIG. 15A is a perspective view of a housing in Embodiment 2.
Figure 15B:
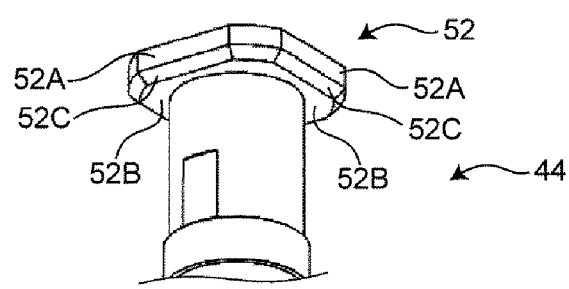
FIG. 15B is a perspective view of the housing in Embodiment 2.
Figure 15C:
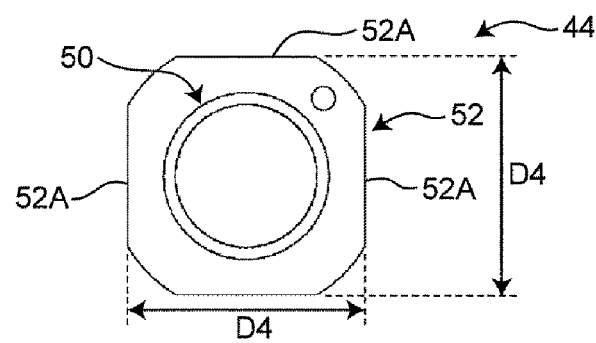
FIG. 15C is a plan view of the housing in Embodiment 2.
Figure 15D:
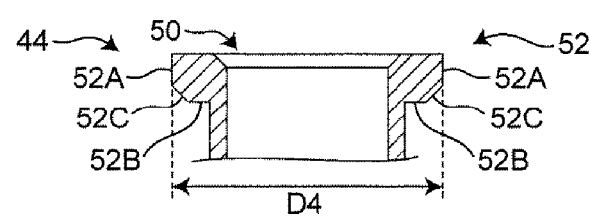
FIG. 15D is a longitudinal sectional view of the housing in Embodiment 2.

As illustrated in FIGS. 15B and 15D, similarly to Embodiment 1, the increased diameter portion 52 has side walls 52A and a bottom wall 52B. The side walls 52A are surfaces disposed so as to face the respective inner side surfaces 54 of the flange 42. The bottom wall 52B is a surface supported by the upper recessed surface 56 of the flange 42. Similarly to Embodiment 1, the side walls 52A are vertical surfaces extending in the vertical direction, and the bottom wall 52B is a horizontal surface extending in horizontal directions.

As illustrated in FIGS. 15C and 15D, a distance D4 between a pair of side walls 52A facing each other is set to be slightly smaller than the distance D3 between side walls MB of the flange 42.

In addition, in Embodiment 2, connection surfaces 52C are disposed between the side walls 52A and the bottom wall 52B. The connection surfaces 52C are surfaces connecting the side walls 52A and the bottom wall 52B. Each of the connection surfaces 52C in Embodiment 2 is a surface inclined downward from the corresponding side wall 52A toward the bottom wall 52B. The connection surface 52C is formed as a flat surface.

Figure 16A:
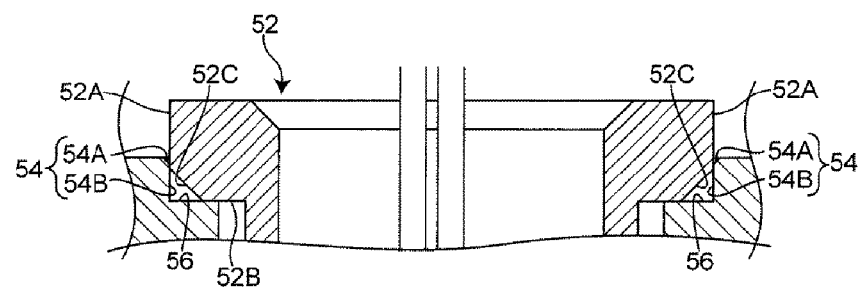
FIG. 16A is a longitudinal sectional view in which the flange and the housing in Embodiment 2 are in contact with each other.
Figure 16B:
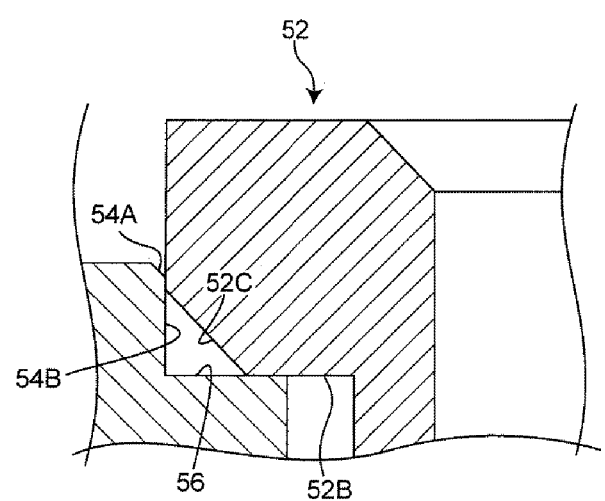
FIG. 16B is a partial enlarged view of FIG. 16A.

The state in which the increased diameter portion 52 is housed in the recessed portion 50 of the flange 42 is described with reference to FIGS. 16A and 16B. FIG. 16A is a longitudinal sectional view in which the increased diameter portion 52 is in contact with the flange 42. FIG. 16B is a partial enlarged view of FIG. 16A.

As illustrated in FIGS. 16A and 16B, the side walls 52A of the increased diameter portion 52 are in contact with or face the respective inner side surfaces 54 of the flange 42 partly. The bottom wall 52B of the increased diameter portion 52 is supported by the upper recessed surface 56 of the flange 42. Such a configuration enables an effect similar to that in Embodiment 1 to be achieved.

In Embodiment 2, in addition to disposing the first surfaces 54A, which are inclined surfaces, at the flange 42, the connection surfaces 52C, which are inclined surfaces, are disposed at an edge of the increased diameter portion 52. Specifically, the increased diameter portion 52 has the connection surfaces 52C connecting the side walls 52A and the bottom wall 52B. Each of the connection surfaces 52C is a surface inclined inward from the corresponding side wall 52A toward the bottom wall 52B. When the housing 44 that has risen from the flange 42 moves downward toward the flange 42, this configuration enables the increased diameter portion 52 to be more easily guided toward the recessed portion 50. As a result, it is possible to dispose the housing 44 in the recessed portion 50 with improved accuracy and to maintain the position of the probe 40 with more improved accuracy.

The present disclosure has been described above by taking Embodiment 1 and Embodiment 2 above as examples but is not limited to Embodiment 1 and Embodiment 2 above. For example, in Embodiment 1 and Embodiment 2 above, the case in which the two coaxial cables 6 and the two probe pins 16 are disposed and the corresponding terminals of the connector 3 are simultaneously subjected to characteristic inspection has been described, but the present disclosure is not limited to such a case. One or three or more coaxial cables 6 and probe pins 16 may be disposed according to the number of terminals of the connector 3 that are expected to be subjected to characteristic inspection. Similarly, the connector 3 is not limited to a multi-line connector including two terminals and may be a single-line connector including only one terminal or a multi-line connector including three or more terminals.

The terms "vertical" and "horizontal" used in Embodiment 1 and Embodiment 2 above respectively denote, in addition to complete verticality and horizontality, verticality and horizontality with slight deviations according to, for example, the accuracy with which the flange 8 is disposed.

Although the spring 10 is disposed in Embodiment 1 and Embodiment 2 above, the present disclosure is not limited to such a case. Another kind of elastic component such as a cylindrical rubber may be disposed.

Although the case in which positioning of the connector 3 is performed by using the projections 22 of the fitting portion 4A has been described in Embodiment 1 and Embodiment 2 above, the present disclosure is not limited to such a case. Any positioning and fitting means such as a recessed portion disposed at the bottom of the fitting portion 4A may be used instead of the projections 22.

The present disclosure is sufficiently described in relation to preferred embodiments with reference to the accompanying drawings. It is obvious to those skilled in the art that various modifications and alterations can be made. It should be understood that such modifications and alterations are included in the present disclosure without departing from the scope of the present disclosure as defined by the accompanying claims. Changes in combinations or sequences of components in the embodiments can be realized without departing from the scope and the idea of the present disclosure.

Any appropriate combination of Embodiment 1, Embodiment 2, and the various modifications can achieve the corresponding effect.

Also, as discussed herein, the present disclosure is applicable to probes for connectors.

What is claimed is:

1. A probe for characteristic inspection of a connector, the probe comprising:
a flange having a through hole disposed so as to extend in a vertical direction;
a coaxial cable that is inserted into the through hole and that extends in an axial direction, a probe pin being connected to a tip of the coaxial cable;

a plunger that contains the probe pin and at which a tip of the probe pin is exposed; and a housing that has a cylindrical shape and that contains the coaxial cable, an end portion on one side of the housing being configured to be fitted to the flange, an end portion on another side of the housing being attached to the plunger, wherein the housing includes a body that has a cylindrical shape and that is inserted into the through hole of the flange, the end portion on the one side of the housing includes an increased diameter portion having an increased diameter of the body in horizontal directions, a recessed portion in an upper surface of the flange and configured as an expansion of the through hole in the horizontal directions so as to receive the increased diameter portion of the housing, the increased diameter portion has side walls configured to be in contact with or to face respective inner side surfaces of the flange partly, the inner side surfaces defining the recessed portion, and a bottom wall configured to be in contact with an upper recessed surface of the flange, the upper recessed surface defining the recessed portion, and one of the following:

the increased diameter portion has connection surfaces connecting the side walls and the bottom wall, each of the connection surfaces being a surface inclined inward from a corresponding one of the side walls toward the bottom wall, or the inner side surfaces of the flange defining the recessed portion each have a first surface inclined downward and a second surface that is a vertical surface extending downward from the first surface and connected to the upper recessed surface of the flange.

2. The probe according to claim 1, wherein
the increased diameter portion has connection surfaces connecting the side walls and the bottom wall, each of the connection surfaces being a surface inclined inward from a corresponding one of the side walls toward the bottom wall.

3. The probe according to claim 2, wherein
in the increased diameter portion, the side walls are vertical surfaces extending in the vertical direction, and the bottom wall is a horizontal surface extending in the horizontal directions.

4. The probe according to claim 1, wherein
the inner side surfaces of the flange defining the recessed portion each have a first surface inclined downward, and
the vertical surface is a second surface that extends downward from the first surface and that is connected to the upper recessed surface of the flange.

5. The probe according to claim 2, wherein
the upper recessed surface of the flange defining the recessed portion is a horizontal surface extending in the horizontal directions.

6. The probe according to claim 4, wherein
in the increased diameter portion, the side walls are vertical surfaces extending in the vertical direction, and the bottom wall is a horizontal surface extending in the horizontal directions.

7. The probe according to claim 4, wherein
the upper recessed surface of the flange defining the recessed portion is a horizontal surface extending in the horizontal directions.

8. The probe according to claim 2, wherein
the bottom wall of the increased diameter portion and the upper recessed surface of the flange defining the recessed portion are flat.

9. The probe according to claim 2, further comprising:
an elastic component configured to urge the flange and the plunger in respective directions away from each other, one end of the elastic component being attached to a position facing the recessed portion in a lower surface of the flange, another end of the elastic component being attached to the plunger.

10. The probe according to claim 1, wherein
in the increased diameter portion, the side walls are vertical surfaces extending in the vertical direction, and the bottom wall is a horizontal surface extending in the horizontal directions.

11. The probe according to claim 1, wherein
the upper recessed surface of the flange defining the recessed portion is a horizontal surface extending in the horizontal directions.

12. The probe according to claim 1, wherein
the bottom wall of the increased diameter portion and the upper recessed surface of the flange defining the recessed portion are flat.

13. The probe according to claim 1, further comprising:
an elastic component configured to urge the flange and the plunger in respective directions away from each other, one end of the elastic component being attached to a position facing the recessed portion in a lower surface of the flange, another end of the elastic component being attached to the plunger.

14. A probe for characteristic inspection of a connector, the probe comprising:

a flange having a through hole disposed so as to extend in a vertical direction;

a coaxial cable that is inserted into the through hole and that extends in an axial direction, a probe pin being connected to a tip of the coaxial cable;

a plunger that contains the probe pin and at which a tip of the probe pin is exposed; and a housing that has a cylindrical shape and that contains the coaxial cable, an end portion on one side of the housing being configured to be fitted to the flange, and an end portion on another side of the housing being attached to the plunger, wherein the housing includes a body that has a cylindrical shape and that is inserted into the through hole of the flange, the end portion on the one side of the housing includes an increased diameter portion having an increased diameter of the body in horizontal directions, a recessed portion in an upper surface of the flange and configured as an expansion of the through hole in the horizontal directions so as to receive the increased diameter portion of the housing, the increased diameter portion has side walls configured to be in contact with or to face respective inner side surfaces of the flange partly, the inner side surfaces defining the recessed portion, and a bottom wall configured to be in contact with an upper recessed surface of the flange, the upper recessed surface defining the recessed portion, and in a state in which the bottom wall of the increased diameter portion is in contact with the upper recessed surface of the flange, a space for moving the increased diameter portion in the horizontal directions is present between the side walls of the increased diameter portion and the inner side surfaces of the flange.

15. The probe according to claim 14, wherein
the increased diameter portion has connection surfaces connecting the side walls and the bottom wall, each of the connection surfaces being a surface inclined inward from a corresponding one of the side walls toward the bottom wall.

16. The probe according to claim 14, wherein
the inner side surfaces of the flange defining the recessed portion each have a first surface inclined downward, and
the vertical surface is a second surface that extends downward from the first surface and that is connected to the upper recessed surface of the flange.

17. The probe according to claim 14, wherein
in the increased diameter portion, the side walls are vertical surfaces extending in the vertical direction, and the bottom wall is a horizontal surface extending in the horizontal directions.

18. The probe according to claim 14, wherein
the upper recessed surface of the flange defining the recessed portion is a horizontal surface extending in the horizontal directions.

19. The probe according to claim 14, wherein
the bottom wall of the increased diameter portion and the upper recessed surface of the flange defining the recessed portion are flat.

20. The probe according to claim 14, further comprising:
an elastic component configured to urge the flange and the plunger in respective directions away from each other, one end of the elastic component being attached to a position facing the recessed portion in a lower surface of the flange, another end of the elastic component being attached to the plunger.

* * * * *